United States Patent

[11] 3,611,058

[72] Inventor Larry Lee Jordan
Kokomo, Ind.
[21] Appl. No. 36,210
[22] Filed May 11, 1970
[45] Patented Oct. 5, 1971
[73] Assignee General Motors Corporation
Detroit, Mich.

[54] VARACTOR DIODE
5 Claims, 4 Drawing Figs.

[52] U.S. Cl. .......... 317/234, 29/576, 317/235
[51] Int. Cl. .......... H01l 5/02
[50] Field of Search .......... 317/234, 235; 29/276

[56] References Cited
UNITED STATES PATENTS 3,038,087 6/1962 Luscher .......... 317/235 X
3,427,515 2/1969 Blicker .......... 317/235
3,538,397 11/1970 Davis .......... 317/235

*Primary Examiner*—James D. Kallam
*Attorneys*—William S. Pettigrew and Robert J. Wallace

ABSTRACT: This disclosure relates to a planar-type junction varactor, and a method for making same, having improved voltage breakdown and leakage current characteristics which can be used as a tuning element in vehicular-type battery operated AM radios. One form of the device can be made by successively depositing semiconductor layers of high and low resistivities onto a low-resistivity substrate including a substantially intrinsic layer, and forming a PN junction within the deposited layers extending to the front surface of the device. A groove from the active surface of the device down to the substrate permits coplanar ohmic contacts on the active surface of the device.

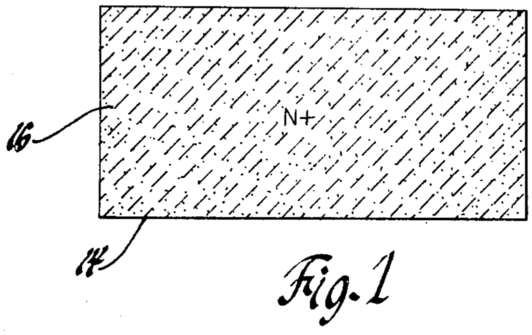
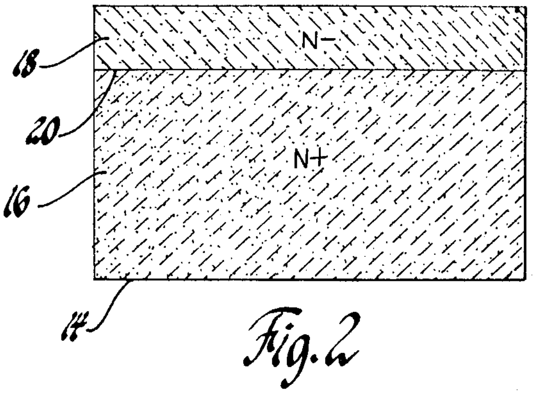
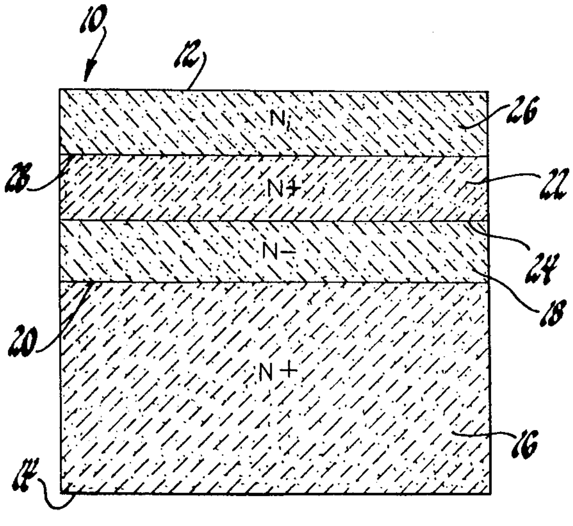
Fig. 3
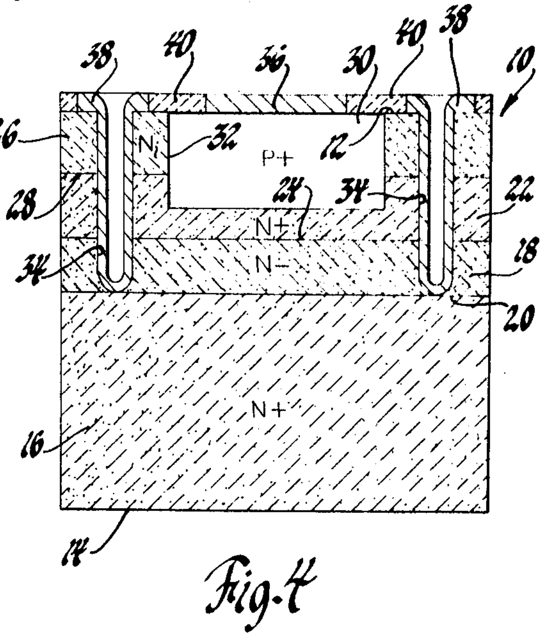
Fig. 4
INVENTOR.
BY Larry Lee Jordan
L. J. Wallace
ATTORNEY

VARACTOR DIODE

This invention relates to junction varactors and more particularly to planar-type junction varactors suitable for use as a tuning element in vehicular-type battery operated AM radios.

Varactors of the PN junction type, or junction varactors, are often preferred to metal-insulator-semiconductor varactors, or surface varactors, due to their relative ease of fabrication. For example, the insulator of a surface varactor must often be reactively sputtered onto the surface of the semiconductor to obtain the desired results. On the other hand, junction varactors can be fabricated using widely used state of the art epitaxial and/or diffusion techniques. Notwithstanding, junction varactors suitable for use as tuning elements in vehicular-type battery operated AM radios must, optimumly, exhibit characteristics generally not found in prior art junction varactors.

Typically, the capacitance of a suitable junction varactor for certain applications should change from about 500 picofarads to about 30 picofarads smoothly over a voltage range of about 8 volts. Additionally, this type of varactor should have a relatively high breakdown voltage, generally in excess of about 12 volts; a low leakage current, generally less than about 50 nanoamperes at about 9 volts; and a low series resistance.

Mesa-type junction varactors can be fabricated to have a generally high voltage breakdown and low current leakage characteristics. However, the PN junction, and especially a shallow junction, of a mesa-type device can be difficult to passivate without affecting its characteristics. If one thermally deposits a protective passivating oxide over such a junction, the location of the PN junction can change due to the temperature necessary to deposit the oxide. For example, in one type of mesa-type varactor having generally the aforesaid characteristics a relatively shallow junction depth of about 0.7 microns is desirable. On the other hand, thermal deposition on a protective oxide on such a mesa device could cause the junction depth to significantly change which could markedly change its characteristics.

Furthermore, it is often necessary that all of the contacts of a device be formed on one surface, generally the active surface of the device. An active surface is herein defined as a surface in which a PN junction terminates. For example, it may be necessary to connect the device into a hybrid thick film integrated circuit with the active surface adjacent to the film. Accordingly, both the active P-type and the N-type regions of such a device should be contactable from the active surface of the device with a low resistance ohmic contact.

It is an object of this invention to provide a planar-type junction varactor suitable for use as a tuning element for a vehicular-type battery operated AM radio.

Another object of this invention is to provide a planar-type junction varactor with a relatively high breakdown voltage, a low leakage current, and a low series resistance yet having coplanar active surface contacts.

Still another object of this invention is to provide an improved method of making a junction varactor having a relatively high breakdown voltage, a low leakage current, and a low series resistance yet having coplanar surface contacts.

According to one aspect of this invention, a method of fabricating a junction varactor includes successively depositing epitaxial layers of high and low resistivity respectively onto a low-resistivity substrate including a substantially intrinsic surface layer; forming a PN junction, which extends to the active surface of the varactor, in two of the deposited layers including the surface layer; etching a groove, circumferentially spaced outwardly from the PN junction, from the active surface of the varactor to the substrate; and depositing ohmic contacts on the active surface of the varactor and in the groove.

Other objects, features and advantages of this invention will become apparent from the following description of the preferred example, and from the drawings in which:

FIGS. 1–3 depict stages in the fabrication of a device in accordance with this invention; and FIG. 4 is a cross-sectional view of a device fabricated in accordance with this invention.

Referring now to FIGS. 1–3, FIG. 3 shows a semiconductor laminate 10 with a front surface 12 and a back surface 14 having successive adjoining layers of silicon material therebetween. Laminate 10 includes an N+ silicon substrate 16, which provides the back surface of the laminate, and an N− layer 18 on layer 16 forming N−N+ interface 20, therebetween. An N+ epitaxial layer 22 is on layer 18 forming an N−N+ interface 24. A substantially intrinsic, or $N_i$, surface layer 26 adjoins region 22 forming an N+$N_i$ interface 28 therebetween. Each of the aforementioned layers are generally coextensive with each other, layer 26 providing front surface 12, or the active surface of the device.

The resistivity of layer 16 is about 0.01 ohm-cm. while the resistivity of layer 22 is about 0.2 ohm-cm. The average resistivity of surface layer 26 is about 10 ohm-cm., while the resistivity of layer 18 is about 15 ohm-cm. However, the resistivity of layer 26 can range from about 0.2 ohm-cm. at interface 28 to more than about 20 ohm-cm. at active surface 12. It should be pointed out that a low resistivity, or N+, layer as herein defined means one in which the resistivity is less than about 0.5 ohm-cm. On the other hand, an N−, or high-resistivity layer is one in which the resistivity is more than about 2 ohm-cm. Turning now to the thickness of each layer, layer 16 is about 8 mils thick. Contrastingly, layer 18 is only about 10 microns thick, while layer 22 and layer 26 are about 0.5 microns thick, respectively.

A P+ diffusion region 30, depicted generally in FIG. 4, extends into the laminate from the active surface a distance of about 0.7 microns. Accordingly, a PN junction 32 is formed within layers 22 and 26 which extends to surface 12 of the laminate. The average resistivity of the diffused P+ region is about an order of magnitude less than the resistivity of layer 22, the surface resistivity of P+ region 30 being about 0.008 ohm-cm. The resistivity of the P+ region increases with distance from surface 12. On the other hand, the resistivity of layers 18 and 22 is generally uniform therethrough.

An annular groove 34 noncontiguously surrounds PN junction 32 and extends from surface 12 to interface 20 through layers 26, 22 and 18. An aluminum, about 1 percent antimony by weight, contact 36 engages the region 30 on surface 12 forming an ohmic connection thereto. Similarly, a gold-antimony contact 38 engages and makes an ohmic connection therewith substrate 16 in groove 34 and also extends out of the groove onto a portion of surface 12 contiguous to the groove. Accordingly, both ohmic contacts of the semiconductor device are coplanar on surface 12. A passivating silicon oxide layer 40 generally overlies surface 12 excluding that portion covered by ohmic contacts 36 and 38.

In order to make a device according to the present invention, a thick monocrystalline N+ slice of silicon having a low resistivity of about 0.01 ohm-cm. can be etched, lapped and polished to a final thickness of about 8 mils. This slice is herein designated as N+ substrate 16. The resistivity of N+ substrate 16 should preferably be about 0.01 ohm-cm. or less in order to minimize series resistance. However, a resistivity of less than about 0.001 ohm-cm. could hinder the epitaxial deposition. On the other hand, a resistivity of more than about 0.1 could introduce too high a series resistance. It should be mentioned that it is not generally commercially practical to process wafers of less than about 5 mils thick. It has been generally observed that the breakage rate of thinner wafers is too high.

The epitaxial depositions of layers 18, 22 and 26 can be made using conventional epitaxial deposition apparatus, not shown. For example, in an epitaxial reactor having an atmosphere of hydrogen and silicon tetrachloride, the silicon substrate layer can be heated to a temperature of about 1200° C. Elemental silicon, resulting from the hydrogen reduction of the silicon tetrachloride, deposits on the wafer and it generally assumes the same crystalline orientation as that of the substrate. Concurrently, with the growth of layer 18 phosphine, in vapor form, can be introduced in a preselected rate forming a layer having an N-type resistivity of about 15 ohm-cm.

After about 10 microns of silicon growth, the preselected rate of phosphine can be increased to provide an ultimate layer resistivity of about 0.2 ohm-cm. in order to form N+ layer 22. After about 0.5 microns of additional silicon growth, the phosphine input can be terminated. Silicon growth can be continued for a period sufficient to grow a layer having a thickness of about 0.5 microns in order to form a layer which is herein designated surface layer 26 or the substantially intrinsic layer.

After the epitaxial growth is terminated, silicon oxide layer 40 can be formed on the device by the known and accepted manner including heating the laminate in an oxygen atmosphere. P+ region 30 can then be accurately formed within layers 22 and 26 by conventional and well-known oxide masking and diffusion techniques. Similarly, the annular groove noncontiguously surrounding region 30 can be formed using any of the known silicon etchants. The ohmic contacts can be formed by any of the standard evaporation techniques.

With reference to the epitaxially deposited surface layer, it should be recognized that although the phosphine input to the reactor is terminated prior to its growth, residual N-type impurities are present in the reactor. Moreover, there is some out diffusion of N-type impurities from layer 22 into the surface layer during its growth. Accordingly, the thicker one grows this surface layer, the more intrinsic it tends to become.

Referring now to the characteristics of the varactor device as generally described, it will exhibit a continuous capacitance change from about 500 picofarads to about 30 picofarads over a voltage range of about 8 volts. By way of summary explanation, the depletion region associated with the PN junction, as a result of the relative resistivities of P+ region 30 and N+ layer 22, will be predominately within layer 22 at a zero voltage condition. As voltage, of correct polarity, is applied, the depletion region quickly expands across layer 22, about 0.3 microns, and into high-resistivity layer 18 causing the capacitance of the device to change as a result of the increased thickness of the depletion region.

It has also been found that a type of junction varactor as described will have a breakdown voltage in excess of 16 volts, while its leakage current at about 9 volts will be about 50 nanoamperes or less. The high breakdown voltage, as described is attributable mostly to the fact that the PN junction of this device terminates within high-resistivity material, i.e., the surface layer. The low leakage current, as described, is generally attributable to the higher resistivities of the surface layer and the N− layer, while the low series resistance of the device is mostly due to the relative thickness of the higher resistivity material. Accordingly, a junction varactor is provided which has a relatively high breakdown voltage, a low leakage current, and a low series resistance yet having coplanar surface contacts.

What is claimed is as follows:

1. A laminated planar-type junction varactor having desired leakage current and breakdown voltage characteristics which comprises a low-resistivity substrate of one conductivity type providing a back surface of the varactor, a high-resistivity layer of said one conductivity type on said substrate layer, a low-resistivity layer of said one conductivity type on said high-resistivity layer, a substantially intrinsic surface layer of said one conductivity type on said low-resistivity layer providing an active surface for the varactor, a region of a second conductivity within said surface layer and said low-resistivity layer forming a PN junction spaced from said high-resistivity layer and extending to said active surface, the average resistivity of said region being an order of magnitude lower than said low-resistivity layer, said laminate having a groove circumferentially spaced outwardly from said PN junction extending from said active surface to said substrate, a first contact on said active surface making ohmic connection to said region, and a second contact in said groove making ohmic connection with said substrate and extending out of said groove over a contiguous portion of said active surface, the second contact thereby being coplanar with and spaced from the first contact on said active surface.

2. A planar-type junction varactor having desired leakage current and breakdown voltage characteristics which comprises a semiconductor laminate having an active surface and a back surface, said laminate including an N+ substrate forming said back surface, an N− epitaxial layer on said substrate layer, an N+ epitaxial layer on said N− epitaxial layer, a substantially intrinsic surface layer of N-type conductivity on said N+ epitaxial layer and forming said active surface, a P+ region within said N+ layer and said surface layer providing a PN junction spaced from said N− epitaxial layer and extending to said active surface, the average resistivity of said P+ region being an order of magnitude less than the average resistivity of said N+ layer, said laminate having a groove circumferentially spaced outwardly from said PN junction extending from said active surface to said substrate, a first contact on said active surface making ohmic connection to said P+ region and a second contact in said groove making ohmic connection with said substrate and extending out of the groove over the contiguous portion of said active surface, the second contact thereby being generally coplanar with the first contact on said active surface.

3. A planar-type junction varactor tuning device for a battery-operated AM radio having desired leakage current and breakdown voltage characteristics which device comprises a silicon laminate having an active surface and a back surface, said laminate including an N+ substrate layer forming said back surface, about a 10 micron thick N− epitaxial layer on said substrate, about 0.5 micron thick N+ conductivity epitaxial layer on said N− epitaxial layer, about a 0.5 micron thick substantially intrinsic surface of N-type conductivity on said second layer and forming said active surface, a P+ region within said N+ and said surface layers which extends about 0.7 microns into said laminate and terminates on said active surface, the average resistivity of said region being an order of magnitude less than the resistivity of said N+ layer, said laminate having a groove surrounding noncontiguously said PN junction extending from said active surface to said substrate layer, a first contact on said active surface making ohmic connection to said P+ region and a second contact spaced from said first contact in said groove making an ohmic connection with said substrate and extending out of said groove over a contiguous portion of said active surface, the second contact thereby being generally coplanar with the first contact on said active surface.

4. A method of making a planar-type junction varactor comprising the steps of, epitaxially depositing a high-resistivity silicon layer on said substrate within an epitaxial reactor by introducing N-type impurities into the reactor at a first predetermined rate, epitaxially depositing a low-resistivity silicon layer on said high-resistivity layer by introducing N-type impurities into the reactor at an increased rate, terminating the flow of N-type impurities into the epitaxial reactor, epitaxially depositing a substantially intrinsic surface layer of silicon on the low-resistivity layer of silicon, forming a P-type region having a resistivity of at least an order of magnitude lower than said low-resistivity layer within said surface layer and said low-resistivity layer, etching a groove spaced from said P-type region through said epitaxial depositions to said substrate, forming separate metallic contacts onto said P-type region and in said groove and on the surface layer contiguous to said groove making ohmic connection to said P-type region and said substrate.

5. A method of making a planar-type junction varactor having desired leakage current and voltage breakdown characteristics comprising the steps of, epitaxially depositing about a 10 micron N− silicon layer on a N+ substrate within an epitaxial reactor by introducing N-type impurities into the reactor at a first predetermined rate, epitaxially depositing about a 0.5 micron N+ silicon layer on the 10 micron layer by introducing N-type impurities into the reactor at an increased rate, terminating the flow of N-type impurities into the epitaxial reactor, epitaxially depositing about 0.5 micron substantially intrinsic surface layer of silicon on the N+ layer of silicon, forming a P+ region within said surface layer and said N+ layer having a resistivity of at least an order of magnitude lower than the N+ layer, etching a groove through said epitaxial depositions to said substrate noncontiguously surrounding said P-type region, forming separate metallic contacts onto said P-type region and in said groove and on the surface layer contiguous to said groove making ohmic connection to said P-type region and said substrate.